United States Patent
Sim et al.

(10) Patent No.: US 9,921,488 B2
(45) Date of Patent: Mar. 20, 2018

(54) MASKLESS EXPOSURE METHOD AND A MASKLESS EXPOSURE DEVICE FOR PERFORMING THE EXPOSURE METHOD

(71) Applicant: SAMSUNG DISPLAY CO., LTD., Yongin, Gyeonggi-do (KR)

(72) Inventors: Jun-Ho Sim, Suwon-si (KR); Jung-In Park, Seoul (KR); Ki-Beom Lee, Seoul (KR); Hi-Kuk Lee, Yongin-si (KR); Hyun-Seok Kim, Hwaseong-si (KR); Kab-Jong Seo, Seoul (KR); Sang-Hyun Yun, Suwon-si (KR); Sang-Hyun Lee, Suwon-si (KR); Jung-Chul Heo, Seoul (KR); Jong-Joo Kim, Gunpo-si (KR); Chang-Hoon Kim, Asan-si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 179 days.

(21) Appl. No.: 14/612,648

(22) Filed: Feb. 3, 2015

(65) Prior Publication Data
US 2016/0048081 A1  Feb. 18, 2016

(30) Foreign Application Priority Data
Aug. 14, 2014  (KR) ........................ 10-2014-0106200

(51) Int. Cl.
G03F 7/20 (2006.01)
G02B 26/08 (2006.01)

(52) U.S. Cl.
CPC ..... *G03F 7/70641* (2013.01); *G02B 26/0833* (2013.01); *G03F 7/2053* (2013.01); *G03F 7/70291* (2013.01); *G03F 7/70383* (2013.01); *G03F 7/70391* (2013.01)

(58) Field of Classification Search
CPC ............. G03F 7/70383; G03F 7/70391; G03F 7/70291; G03F 7/70641; G03F 7/2053; G02B 26/0833
See application file for complete search history.

(56) References Cited

U.S. PATENT DOCUMENTS

| | | | |
|---|---|---|---|
| 6,243,122 B1 | 6/2001 | Nakamura et al. | |
| 2011/0242520 A1* | 10/2011 | Kosugi | G03F 7/706 355/77 |
| 2012/0241740 A1* | 9/2012 | Park | H01L 27/1288 257/49 |
| 2013/0001898 A1* | 1/2013 | Kim | H01L 21/681 279/126 |
| 2013/0114081 A1* | 5/2013 | Fukazawa | G01N 21/9501 356/369 |

FOREIGN PATENT DOCUMENTS

| | | |
|---|---|---|
| KR | 1020070049694 | 5/2007 |
| KR | 1020090010374 | 1/2009 |
| KR | 1020110087401 | 8/2011 |

\* cited by examiner

*Primary Examiner* — Michelle M Iacoletti
(74) *Attorney, Agent, or Firm* — F. Chau & Associates, LLC

(57) ABSTRACT

A maskless exposure device includes a stage on which a substrate is disposed, an optical head, and an optical source part. The optical head irradiates light to the substrate. The light source part provides the optical head with a light. The optical head irradiates the light, according to an average-focus distance, to the substrate. The average-focus distance is determined by averaging best-focus distances for a plurality of regions of the substrate, respectively.

12 Claims, 6 Drawing Sheets

MASKLESS EXPOSURE METHOD AND A MASKLESS EXPOSURE DEVICE FOR PERFORMING THE EXPOSURE METHOD

CROSS-REFERENCE TO RELATED APPLICATION

This application claims priority under 35 U.S.C. § 119 to Korean Patent Application No. 10-2014-0106200, filed on Aug. 14, 2014, in the Korean Intellectual Property Office (KIPO), the disclosure of which is incorporated by reference herein in its entirety.

TECHNICAL FIELD

Exemplary embodiments of the present inventive concept relate to a maskless exposure method and a maskless exposure device for performing the maskless exposure method.

DISCUSSION OF THE RELATED ART

A maskless exposure device having a plurality of spot beams, instead of a mask pattern, has been developed. In the maskless exposure device, the spot beams are independently turned on or off so that the beams are selectively provided to the substrate.

The maskless exposure device may include a distance measurement sensor configured to measure a distance between its optical head and an exposing-surface of a substrate. The distance measurement sensor may be disposed at a center of the optical head. However, the exposing-surface of the substrate may not be completely flat. Therefore, light which is irradiated from the optical head may not be evenly applied to the substrate, since a focus point of the optical head is the center of the substrate. Accordingly, a defect (e.g., a stain) in a display panel may occur.

SUMMARY

According to an exemplary embodiment of the present inventive concept, a maskless exposure device is provided. The maskless exposure device includes a stage, an optical head, and a light source part. A substrate is disposed at the stage. The optical head is configured to irradiate light to the substrate. The light source part is configured to provide the optical head with the light. The optical head irradiates the light according to an average-focus distance to the substrate. The average-focus distance is determined by averaging best-focus distances which each correspond to one of a plurality of regions of the substrate.

In an exemplary embodiment of the present inventive concept, the optical head may include a distance measurement sensor and a focus controller. The distance measurement sensor is configured to measure a distance between the optical head and an exposing-surface of the substrate. The focus controller unit is configured to control a focus distance by using the distance measured by the distance measurement sensor.

In an exemplary embodiment of the present inventive concept, the distance measurement sensor may be disposed at a center of the optical head.

In an exemplary embodiment of the present inventive concept, in each of the plurality of regions, a patterned wiring patterned when the light of the optical head is irradiated to the substrate based on the best-focus distance may have a smaller width than widths of wirings patterned when the light of the optical head is irradiated to the substrate based on focus distances other than the best-focus distance.

In an exemplary embodiment of the present inventive concept, the optical head may include a plurality of spot beams.

In an exemplary embodiment of the present inventive concept, the spot beams may irradiate the light at the same focus distance.

In an exemplary embodiment of the present inventive concept, the optical head may include a beam splitter, a digital micro-mirror device, and an optical system. The beam splitter may be configured to reflect the light from the light source part. The light reflected by the beam splitter may be provided to the micro-mirror device. The light selectively reflected by the digital micro-mirror device may be provided to the optical system.

In an exemplary embodiment of the present inventive concept, the digital micro-mirror device may be arranged to have a matrix shape.

In an exemplary embodiment of the present inventive concept, the optical system may include a plurality of lenses.

According to an exemplary embodiment of the present inventive concept, a method of performing maskless exposure to a substrate is provided. The substrate includes a first region and a second region. The method includes measuring widths of first wirings according to distances between an optical head and surfaces of the first region and widths of second wirings according to distances between the optical head and surfaces of the second region, determining a first best-focus distance by using the measured widths of the first wirings and a second best-focus distance by using the measured widths of the second wirings, calculating an average-focus distance by using the first and second best-focus distances, and irradiating light by using the average-focus distance.

In an exemplary embodiment of the present inventive concept, in the first region, a wiring patterned when the light of the optical head is irradiated to the substrate based on the first best-focus distance may have a smaller width than widths of wirings patterned when the light of the optical head is irradiated to the substrate based on focus distances other than the first best-focus distance.

In an exemplary embodiment of the present inventive concept, the optical head may include a distance measurement sensor and a focus controller unit. The distance measurement sensor may be configured to measure the distances between the optical head and the exposing-surface of the substrate. The focus controller unit may be configured to control a focus distance by using the distances measured by the distance measurement sensor.

In an exemplary embodiment of the present inventive concept, the distance measurement sensor may be disposed at a center of the optical head.

In an exemplary embodiment of the present inventive concept, the optical head may include a plurality of spot beams.

In an exemplary embodiment of the present inventive concept, the spot beams may irradiate the light at the same focus distance.

In an exemplary embodiment of the present inventive concept, the optical head may include a beam splitter, a digital micro-mirror device, and an optical system. The beam splitter may be configured to reflect the light from a light source part. The light reflected by the beam splitter may be provided to the digital micro-mirror device. The light selectively reflected by the digital micro-mirror device may be provided to the optical system.

In an exemplary embodiment of the present inventive concept, the digital micro-mirror device may be arranged to have a matrix shape.

In an exemplary embodiment of the present inventive concept, the optical system may include a plurality of lenses.

According to an exemplary embodiment of the present inventive concept, a maskless exposure device is provided. The maskless exposure device includes a stage and an optical head. A substrate is disposed at the stage. The substrate includes a first region and a second region. The optical head is configured to irradiate light to the substrate based on an average-focus distance. The average-focus distance is obtained by obtaining widths of first wirings according to distances between the optical head and surfaces of the first region and widths of second wirings according to distances between the optical head and surfaces of the second region, determining a first focus distance corresponding to the first region based on the obtained widths of the first wirings and a second focus distance corresponding to the second region based on the obtained widths of the second wirings, and determining the average-focus distance based on the first focus distance and the second focus distance.

In an exemplary embodiment of the present inventive concept, the maskless exposure device may be inclined by an angle with respect to the substrate.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Hereinafter, exemplary embodiments of the present inventive concept will be described in detail with reference to the accompanying drawings.

Figure 1:
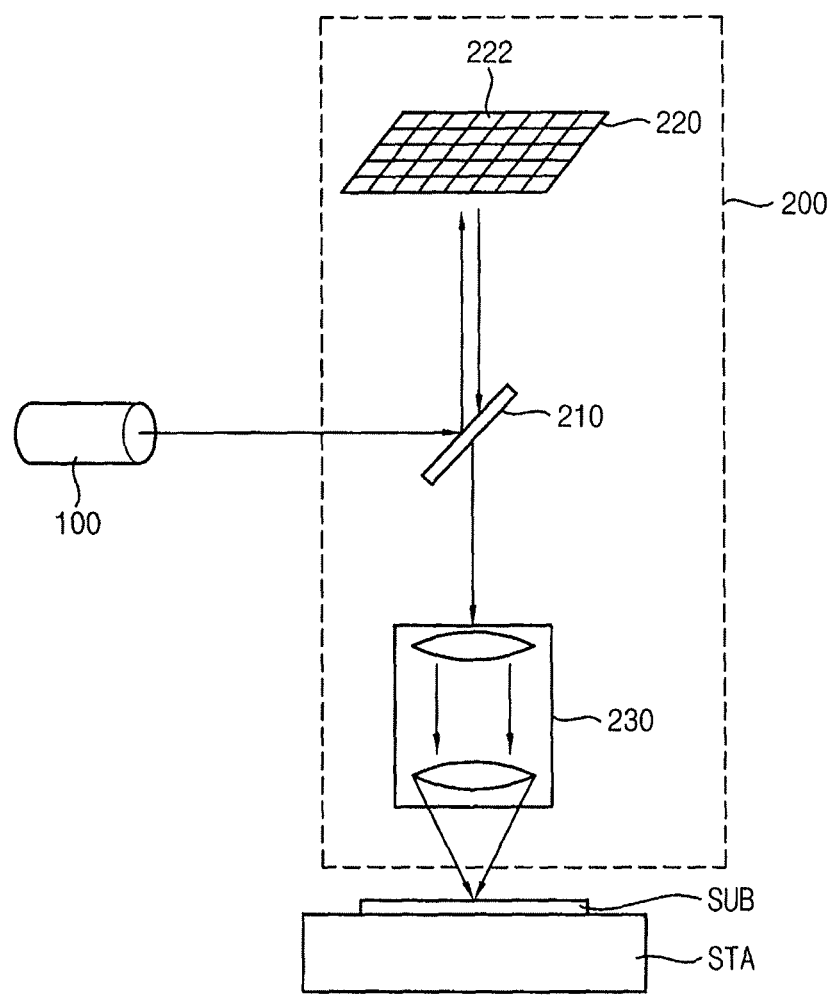
FIG. 1 is a view of a maskless exposure device according to an exemplary embodiment of the present inventive concept.
Figure 2:
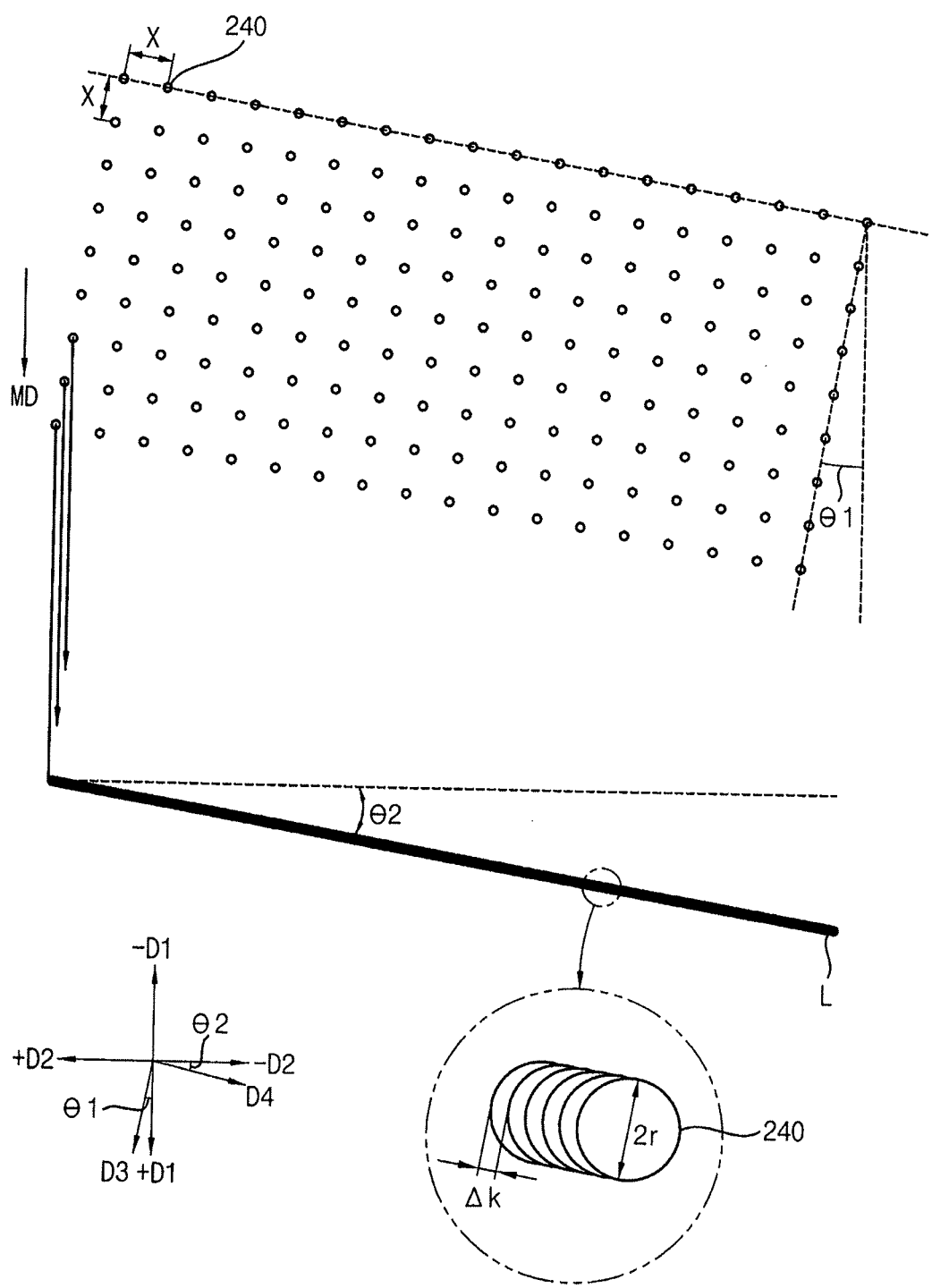
FIG. 2 is a plan view illustrating an exposure step using an optical head in FIG. 1 according to an exemplary embodiment of the present inventive concept.

FIG. 1 is a view of a maskless exposure device according to an exemplary embodiment of the present inventive concept. FIG. 2 is a plan view illustrating an exposure step using an optical head in FIG. 1 according to an exemplary embodiment of the present inventive concept.

Referring to FIGS. 1 and 2, a maskless exposure device includes a light source 100 for generating a light, an optical head 200 for receiving the light output from the light source 100, and a stage STA for receiving the light output from the optical head 200. In an exemplary embodiment of the present inventive concept, the maskless exposure device may include a plurality of optical heads 200.

The light source 100 emits a laser beam to the optical head 200.

The optical head 200 includes a beam splitter 210, a digital micro-mirror device (DMD) 220, and an optical system 230.

The beam splitter 210 may reflect and transmit the laser beam emitted from the light source 100. The laser beam reflected by the beam splitter 210 is provided to the DMD 220. The beam splitter 210 receives light reflected from the DMD 220 and provides the light to the optical system 230.

The DMD 220 includes a plurality of micro-mirrors 222. The micro-mirrors 222 may be arranged as a matrix shape of m×n. Here, m and n may be integers. Each of the micro-mirrors 222 may reflect the light received from the beam splitter 210. The DMD 220 may selectively reflect the light received from the beam splitter 210 based on image data that forms an image provided onto a substrate SUB disposed on the stage STA.

The optical head 200 may further include a mirror controlling part for controlling each of the micro-mirrors 222 based on the image data. The mirror controlling part may output a signal that controls turning on or off each of the micro-mirrors 222. When the micro-mirrors 222 receive activated data, the number of reflected beams provided to the optical system 230 is substantially the same as the number of the micro-mirrors 222.

The optical system 230 includes a plurality of lenses. The optical system 230 transforms the reflected beams provided from the DMD 220 into a plurality of spot beams 240. The optical system 230 concentrates the reflected beams emitted from the DMD 220 and increases distances between the reflected beams.

The maskless exposure device irradiates the spot beams 240 onto the substrate SUB disposed on the stage STA so that a photosensitive layer formed on the substrate SUB is exposed. Hereinafter, "exposing the substrate SUB" may be understood to be substantially the same as exposing the substrate SUB on which the photosensitive layer is formed.

The maskless exposure device is fixed to be inclined by a first angle $\theta_1$ with respect to a side of the substrate SUB extending in a first direction +D1 and −D1. When a second direction +D2 and −D2 is defined as a direction substantially perpendicular to the first direction +D1 and −D1, an inclined direction of the maskless exposure device is between the first direction +D1 and −D1 and the second direction +D2 and −D2. Hereinafter, the first direction +D1 and −D1 is divided into a positive first direction +D1 and a negative first direction −D1, and the second direction +D2 and −D2 is divided into a positive second direction +D2 and a negative second direction −D2.

The inclined direction of the maskless exposure device may be a third direction D3 between the positive first direction +D1 and the positive second direction +D2. The first angle $\theta_1$ is defined as an acute angle clockwise rotated with respect to a reference line extending in the first direction +D1 and −D1. For example, the first angle $\theta_1$ may be between about 0.1° and about 0.5°.

The maskless exposure device inclined with respect to the third direction D3 provides the spot beams 240 onto the substrate SUB along a scanning direction MD. The scanning direction MD is substantially the same as the first positive direction +D1. When the first angle $\theta_1$ of the maskless exposure device is about 0° and the maskless exposure device exposes the substrate SUB along the positive first direction +D1, a region between adjacent spot beams 240 of the substrate SUB may not be exposed. Therefore, to entirely expose a predetermined region in the substrate SUB, the maskless exposure device inclined with respect to the substrate SUB by the first angle $\theta_1$ provides the light onto the substrate SUB.

When the micro-mirrors 222 receive the activated data and the spot beams 240 are irradiated onto the substrate SUB which is stopped, the spot beams 240 are spaced apart from each other in the third direction D3 by a predetermined distance "x." In addition, the spot beams 240 are spaced apart from each other in a direction substantially perpendicular to the third direction D3 by the determined distance "x."

To selectively expose a predetermined region (e.g., a pattern-formed region L) of the substrate SUB, the spot beams 240 are selectively irradiated to the pattern-formed region L. In an exemplary embodiment of the present inventive concept, the pattern-formed region L may be a region extending in a fourth direction D4 inclined in a clockwise direction with respect to a side of the substrate SUB by a second angle $\theta_2$. The pattern-formed region L may be designed to have a rectangular shape extending in the fourth direction D4. For example, the pattern-formed region L may be designed by an operator. Each of the spot beams 240 may have a circular shape having a diameter of "2r". The spot beams 240 overlap each other, separated by a predetermined distance "Δk" on the pattern-formed region L, and thus, the pattern-formed region L of the substrate SUB may be entirely exposed.

Figure 3:
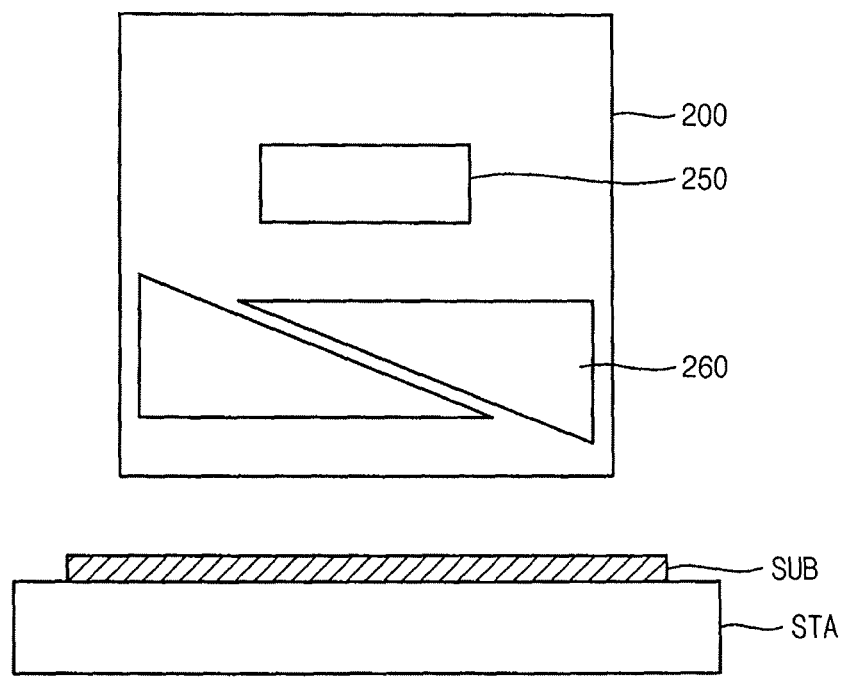
FIG. 3 is a view of an optical head of a maskless exposure device according to an exemplary embodiment of the present inventive concept.

FIG. 3 is a view of an optical head of a maskless exposure device according to an exemplary embodiment of the present inventive concept.

Referring to FIG. 3, an optical head 200 of a maskless exposure device according to an exemplary embodiment of the present inventive concept may include a distance measurement sensor 250 and a focus controller unit 260.

The distance measurement sensor 250 may measure a distance between the optical head 200 and an exposing-surface of the substrate SUB. The distance measurement sensor 250 may be disposed at a center of the optical head 200. Thus, the distance measurement sensor 250 may measure a distance between the center of the optical head 200 and an exposing-surface of the substrate SUB.

The optical head 200 according to an exemplary embodiment of the present inventive concept may include a plurality of spot beams 240. For example, the optical head 200 may include 1920×432 spot beams 240. Best-focus distances of the spot beams 240 may be different from each other depending on a position in the substrate SUB. Thus, the plurality of spot beams 240 disposed in the optical head 200 may have different best-focus distances from each other. Since the distance measurement sensor 250 is disposed at a center of the optical head 200, the distance measurement sensor 250 may measure a distance between the center of the optical head 200 and an exposing-surface of the substrate SUB. Therefore, best-focus distances of spot beams 240 in the center of the optical head 200 or a region adjacent to the center of the optical head 200 may be precisely calculated. Hereinafter, the center of the optical head 200 or the regions adjacent to the center of the optical head 200 may be referred to as a "center region". In addition, best-focus distances of spot beams 240 in regions except for the region adjacent to the center region of the optical head 200 may not be precisely calculated. Hereinafter, the regions other than the center region may be referred to as "peripheral regions".

The focus controller unit 260 measures a reference distance. For example, the reference distance may correspond to a distance between the optical head 200 and a reference surface. Based on a difference between the reference distance and a first distance from the optical head 200 to the exposing-surface of the substrate SUB, the focus controller unit 260 controls the focus of the beam (e.g., spot beam 240) emitted from the optical head 200 to the exposing-surface of the substrate SUB. For example, the focus controller unit 260 increases or reduces the focus of the beam emitted from the optical head 200 from an initial value based on the reference distance and the first distance between the optical head 200 and an exposing-surface of the substrate SUB.

Figure 4:
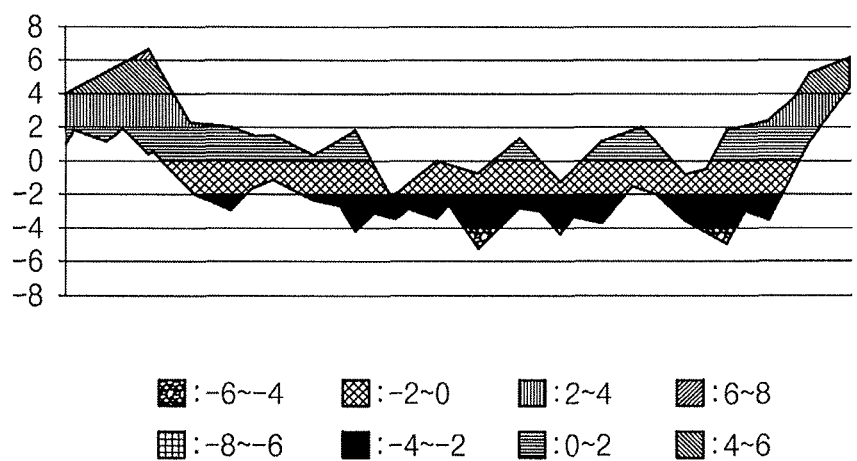
FIG. 4 is a cross-sectional view of a focal plane of spot beams of an optical head according to an exemplary embodiment of the present inventive concept.

FIG. 4 is a cross-sectional view of a focal plane of spot beams of an optical head according to an exemplary embodiment of the present inventive concept.

Referring to FIG. 4, a focal plane corresponding to the center of the optical head 200 has an error of '0 nm' with respect to a best-focus distance. Focal planes of the peripheral regions of the optical head 200 have errors up to about '6 nm' with respect to the best-focus distance.

Therefore, the optical head 200 may irradiate light with a desired focus distance at the center region of the optical head 200. For example, at the center region of the optical head 200, light having a desired focus distance may be irradiated to the substrate SUB. In addition, the optical head 200 may not irradiate the light having with the desired focus distance at the peripheral regions other than the center region of the optical head 200. For example, at the peripheral regions of the optical head 200, light having the desired focus distance may not be irradiated to the substrate SUB. Accordingly, a defect in exposing may occur and thus, a fault (e.g., a stain) in a display panel may occur.

Figure 5:
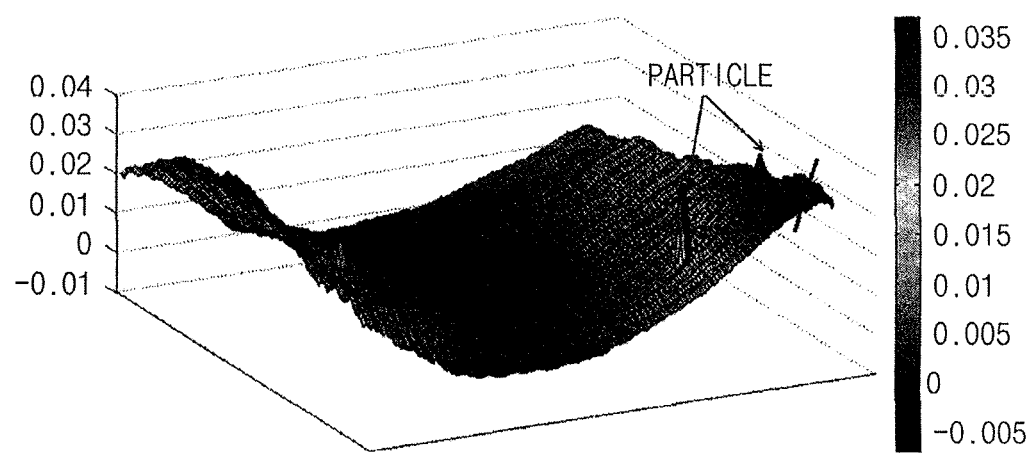
FIG. 5 is a graph illustrating a flatness of a substrate exposed by a maskless exposure device according to an exemplary embodiment of the present inventive concept.

FIG. 5 is a graph illustrating a flatness of a substrate exposed by a maskless exposure device according to an exemplary embodiment of the present inventive concept.

Referring to FIG. 5, a flatness of a substrate SUB exposed by a maskless exposure device according to an exemplary embodiment of the present inventive concept is illustrated. The center region of the substrate SUB may be relatively flat. The peripheral region other than the center region of the substrate SUB may not be flat. In addition, flatness of the substrate SUB may be changed by a particle on the substrate SUB.

The focal plane is a plane on which the light irradiated from the optical head 200 is focused. Therefore, an actual focal plane may be related a best-focus of the optical head 200 as well as a flatness of a substrate SUB exposed by a maskless exposure device. For example, a degree of focusing of the light may depend on a best-focus of the optical head 200 and a flatness of a substrate SUB.

The optical head 200 according to an exemplary embodiment of the present inventive concept may scan a certain scan region. For example, one optical head 200 according to an exemplary embodiment of the present inventive concept may scan a scan region of 66.5 mm. In addition, one optical head 200 according to an exemplary embodiment of the present inventive concept may perform an exposing process based on one focus distance.

The focus controller unit 260 measures a reference distance. For example, the reference distance may correspond to a distance between the optical head 200 and a reference surface. Based on a difference between the reference distance and a first distance from the optical head 200 to the exposing-surface of the substrate SUB, the focus controller unit 260 controls the focus of the beam (e.g., spot beam 240) emitted from the optical head 200 to the exposing-surface of the substrate SUB. Therefore, a best-focus distance may be changed depending on a scan position of the optical head 200. In addition, the flatness of the substrate SUB may be changed according to a position in the substrate SUB. Therefore, a degree of de-focusing may be changed depending on a position in the substrate SUB although the substrate SUB is exposed by the same optical head.

In addition, since the distance measurement sensor 250 is disposed at a center of the optical head 200, the distance measurement sensor 250 may measure a distance between the center of the optical head 200 and an exposing-surface of the substrate SUB. Best-focus distances of spot beams 240 in the peripheral regions except for the center region of the optical head 200 may not be precisely calculated. Therefore, the optical head 200 may irradiate light with a desired focus distance at the center of the optical head 200. The optical head 200 may not irradiate light with the desired focus distance at the peripheral regions except for the center region of the optical head 200. Accordingly, a defect in exposing may occur and a fault (e.g., a stain) in a display panel may occur.

Figure 6:
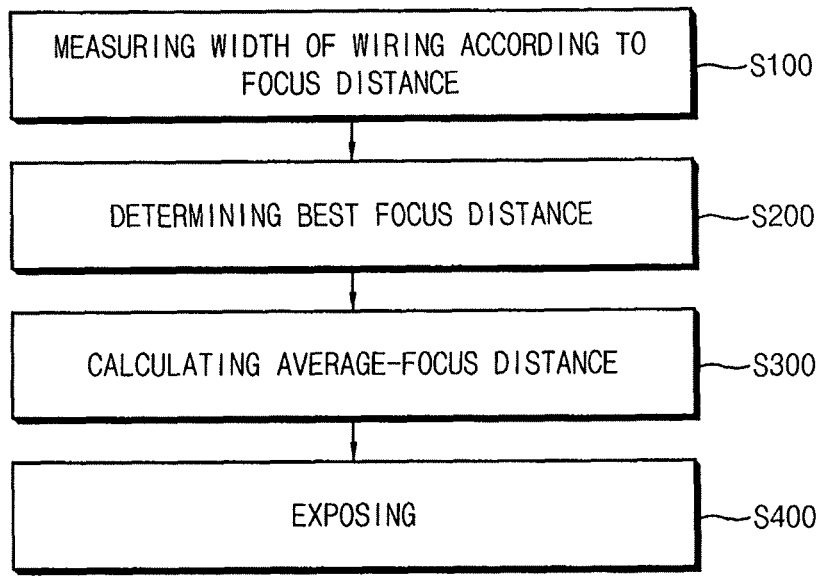
FIG. 6 is a flowchart illustrating a maskless exposure method according to an exemplary embodiment of the present inventive concept.
Figure 7:
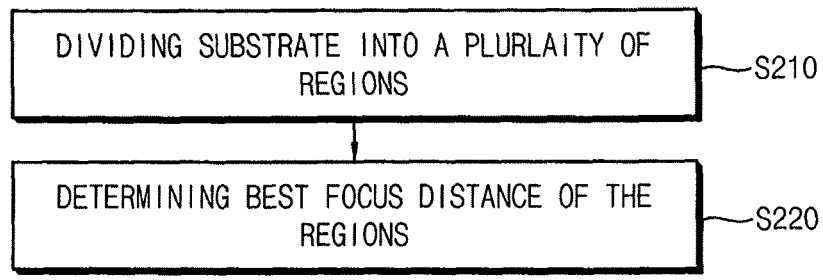
FIG. 7 is a flowchart illustrating a method of determining a best-focus distance according to an exemplary embodiment of the present inventive concept.
Figure 8:
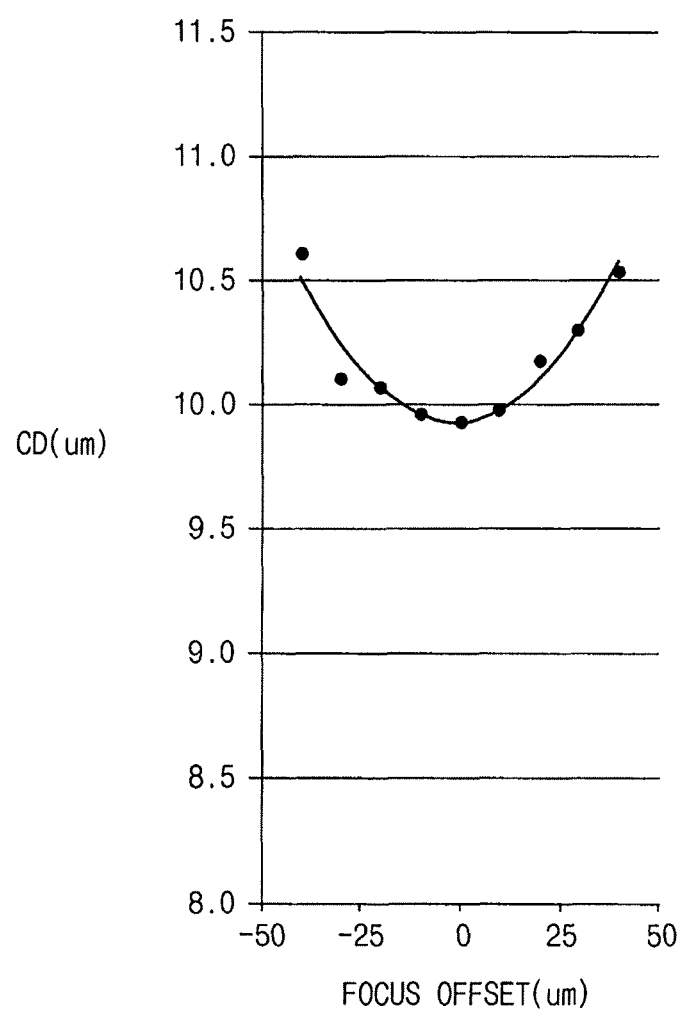
FIG. 8 is a graph illustrating a relationship between a focus distance and a width of a wiring according to an exemplary embodiment of the present inventive concept.

FIG. 6 is a flowchart illustrating a maskless exposure method according to an exemplary embodiment of the present inventive concept. FIG. 7 is a flowchart illustrating a method of determining a best-focus distance according to an exemplary embodiment of the present inventive concept. FIG. 8 is a graph illustrating a relationship between a focus distance and a width of a wiring.

Referring to FIGS. 6 to 8, a maskless exposure method according to an exemplary embodiment of the present inventive concept may include measuring widths (e.g., a critical dimension (CD)) of wirings according to a distance between an optical head 200 and an exposing-surface of a substrate SUB S100, determining a best-focus distance based on the measured widths of wirings according to a distance between the optical head and the exposing-surface of the substrate SUB S200, calculating an average-focus distance based on the best-focus distance S300, and irradiating light to the substrate SUB based on the average-focus distance S400.

In the process of measuring widths of wirings according to a distance between an optical head and an exposing-surface of a substrate SUB S100, widths of wirings according to a focus distance may be measured. When an exposing process is performed for each focus distance, widths of patterned wirings according to each focus distance may be measured. For example, when an exposing process is performed at a desired focus distance, the exposing process may be performed based on a relatively big spot beam and thus, widths of patterned wirings may have relatively small values. In addition, when an exposing process is not performed at the desired focus distance, the exposing process may be performed based on a relatively small spot beam and thus, widths of patterned wirings may have relatively big values.

In the process of determining a best-focus distance based on the measured widths of wirings according to a distance between the optical head and the exposing-surface of the substrate SUB S200, the best-focus distance may be determined based on the measured value.

When an exposing process is performed at a best-focus distance, widths of patterned wirings may have the smallest value. For example, widths of wirings patterned when an exposing process is performed at a best-focus distance may be smaller than widths of wirings patterned when the exposing process is performed at focus distances other than the best-focus distance. Therefore, the best-focus distance is a distance between the optical head 200 and an exposing-surface of the substrate SUB when a patterned wiring has the smallest width.

Determining the best-focus distance based on the measured width of wirings S200 may include dividing the substrate SUB into a plurality of regions S210 and determining the best-focus distances for the plurality of regions in the substrate SUB, respectively S220.

The optical head 200 according to an exemplary embodiment of the present inventive concept may include a plurality of spot beams 240. For example, the optical head 200 may include 1920×432 spot beams 240. Best-focus distances of the spot beams 240 may be different from each other depending on a position in the substrate SUB. Thus, a plurality of spot beams 240 disposed in the optical head 200 may have different best-focus distances from each other. Since the distance measurement sensor 250 is disposed at a center of the optical head 200, the distance measurement sensor 250 may measure a distance between the center of the optical head 200 and an exposing-surface of the substrate SUB. Therefore, best-focus distances of spot beams 240 in center region of the optical head 200 may be precisely calculated. In addition, best-focus distances of spot beams 240 in peripheral regions other than the center region of the optical head 200 may not be precisely calculated.

Flatness of a substrate SUB exposed by a maskless exposure device may not be uniform. For example, center region (e.g., the center of the substrate or a region adjacent to the center of the substrate) of the substrate SUB may be relatively flat, and peripheral regions (e.g., regions other than the center region) of the substrate SUB may not be flat. In addition, the flatness of the substrate SUB may be changed by a particle on the substrate SUB. Therefore, the plurality of regions of the substrate SUB may have different best-focus distances from each other due to the non-uniform flatness of the substrate SUB.

Therefore, a best-focus distance is determined for each of the plurality of regions in the substrate SUB to perform a precise exposing process.

For each of the plurality of regions in the substrate SUB, widths of wirings according to a distance (e.g., a focus distance) between an optical head and an exposing-surface of a substrate SUB are measured, a best-focus distance is determined based on the measured widths of wirings according to a distance between the optical head and the exposing-surface of the substrate SUB.

For example, when an exposing process is performed at each focus distance, widths of patterned wirings according to each focus distance may be measured. In addition, when an exposing process is performed at a desired focus distance (e.g., a best-focus distance), the exposing process may be performed based on a relatively big spot beam and thus, widths of patterned wirings may have relatively small values. In addition, when an exposing process is not performed at the desired focus distance, the exposing process may be performed based on a relatively small spot beam and thus, widths of patterned wirings may have relatively big values.

In the process of determining the best-focus distance for each of the plurality of regions S220, the best-focus distance is determined based on the measured value for each of the plurality of regions.

When an exposing process is performed at a best-focus distance, widths of patterned wirings may have the smallest value. Therefore, the best-focus distance is a distance (e.g., a focus distance) between the optical head 200 and an exposing-surface of the substrate SUB when a patterned wiring has the smallest width. For example, widths of wirings patterned when an exposing process is performed at a best-focus distance may be smaller than widths of wirings patterned when the exposing process is performed at focus distances other than the best-focus distance.

In the process of calculating an average-focus distance based on the best-focus distances S300, the average-focus distance may be calculated based on the best-focus distances for the plurality of regions in the substrate SUB, respectively.

The optical head 200 may irradiate light with a desired focus distance (e.g., a best-focus distance) at the center region of the optical head 200. In addition, the optical head 200 may not irradiate light with the desired focus distance at the peripheral regions other than the center region of the optical head 200. In addition, when an exposing process is performed based on an average of the best-focus distances corresponding to the plurality of regions, respectively, the optical head 200 may irradiate light having a desired focus distance (e.g., an average focus distance) to the entire region of the substrate SUB. For example, differences in best-focus distance between the center region and the peripheral regions may be decreased. Therefore, the optical head 200 may irradiate light having a desired focus distance (e.g., an average focus distance) to the entire region of the substrate SUB.

In the process of irradiating light based on the average-focus distance S400, the substrate SUB is exposed by the maskless exposure device at the average-focus distance calculated in the process of calculating an average-focus distance based on the best-focus distance S300.

The average-focus distance is an average value of the best-focus distances corresponding to the plurality of regions, respectively. Therefore, when an exposing process is performed based on the average-focus distance, the optical head 200 may irradiate light having a desired focus distance (e.g., the average-focus distance) to the entire region of the substrate SUB.

According to an exemplary embodiment of the present inventive concept, the substrate SUB includes a plurality of regions, and best-focus distances for the plurality of regions are determined. In addition, an average value of the best-focus distances is calculated, and an exposing process is performed based on the calculated average value of the best-focus distances.

Defocusing may occur in peripheral regions other than center region of the substrate SUB due to non-uniform flatness of the substrate SUB. In addition, an exposing process is performed based on an average-focus distance and thus, the defocusing may be decreased. Therefore, a defect on a display apparatus may be reduced.

The foregoing is illustrative of the present inventive concept. The present inventive concept should not be construed as limited to the exemplary embodiments thereof. For example, although a few exemplary embodiments of the present inventive concept have been described, it will be understood that various modifications in form and details may be made therein without departing from the spirit and scope of the present inventive concept described above and hereafter claimed.

What is claimed is:

1. A maskless exposure device comprising:
    a stage on which a substrate is disposed;
    an optical head configured to irradiate light to the substrate and to measure a first distance between the optical head and an exposing surface of the substrate, wherein the optical head includes a focus controller unit configured to measure a reference distance between the optical head and a reference surface and to control a focus distance based on a difference between the reference distance and the first distance; and
    a light source part configured to provide the optical head with the light, and
    wherein the optical head irradiates the light, according to an average-focus distance, to the substrate,
    wherein the average-focus distance is determined by averaging best-focus distances each corresponding to one of a plurality of regions of the substrate.

2. The maskless exposure device of claim 1, wherein the optical head comprises a distance measurement sensor configured to measure the first distance between the optical head and an exposing-surface of the substrate, and
    wherein the distance measurement sensor is disposed at a center of the optical head.

3. The maskless exposure device of claim 1, wherein, in each of the plurality of regions, a wiring patterned when the light of the optical head is irradiated to the substrate based on the best-focus distance has a smaller width than widths of wirings patterned when the light of the optical head is irradiated to the substrate based on focus distances other than the best-focus distance.

4. The maskless exposure device of claim 1, wherein the optical head comprises a plurality of spot beams.

5. The maskless exposure device of claim 4, wherein the spot beams irradiate the light at the same focus distance.

6. The maskless exposure device of claim 1, wherein the optical head comprises:
    a beam splitter configured to reflect the light from the light source part;
    a digital micro-mirror device to which the light reflected by the beam splitter is provided; and
    an optical system to which the light selectively reflected by the digital micro-mirror device is provided.

7. The maskless exposure device of claim 6, wherein the digital micro-mirror device is arranged to have a matrix shape.

8. The maskless exposure device of claim 6, wherein the optical system comprises a plurality of lenses.

9. A method of performing maskless exposure to a substrate including a first region and a second region, the method comprising:
    measuring widths of first wirings according to distances between an optical head and surfaces of the first region and widths of second wirings according to distances between the optical head and surfaces of the second region;
    determining a first best-focus distance by using the measured widths of the first wirings and a second best-focus distance by using the measured widths of the second wirings;
    calculating an average-focus distance by using the first and second best-focus distances; and
    irradiating light by using the average-focus distance, wherein the optical head comprises:

a distance measurement sensor configured to measure the distances between the optical head and an exposing-surface of the substrate; and a focus controller unit configured to control a focus distance by using the distances measured by the distance measurement sensor.

10. The method of claim 9, wherein the distance measurement sensor is disposed at a center of the optical head.

11. A maskless exposure device comprising:

a stage on which a substrate is disposed; and an optical head configured to irradiate light to the substrate based on an average-focus distance and to measure a first distance between the optical head and an exposing surface of the substrate, wherein the optical head includes a focus controller unit configured to measure a reference distance between the optical head and a reference surface and to control a focus distance based on a difference between the reference distance and the first distance, wherein the substrate includes a first region and a second region, wherein the average-focus distance is obtained by:

obtaining widths of first wirings according to distances between the optical head and surfaces of the first region and widths of second wirings according to distances between the optical head and surfaces of the second region;

determining a first focus distance corresponding to the first region based on the obtained widths of the first wirings, wherein a smallest width of each first wiring of the first wirings is used to determine the first focus distance, and a second focus distance corresponding to the second region based on the obtained widths of the second wirings, wherein a smallest width of each second wiring of the second wirings is used to determine the second focus distance; and determining the average-focus distance based on the first focus distance and the second focus distance.

12. The maskless exposure device of claim 11, wherein the maskless exposure device is inclined by an angle with respect to the substrate.

* * * * *